(12) United States Patent
Akahane

(10) Patent No.: US 11,228,307 B2
(45) Date of Patent: Jan. 18, 2022

(54) OVERCURRENT DETECTION DEVICE, CONTROL DEVICE, AND OVERCURRENT DETECTION METHOD

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 92 days.

(21) Appl. No.: 16/589,122

(22) Filed: Sep. 30, 2019

(65) Prior Publication Data

US 2020/0036374 A1  Jan. 30, 2020

Related U.S. Application Data

(63) Continuation of application No. PCT/JP2018/032505, filed on Aug. 31, 2018.

(30) Foreign Application Priority Data

Oct. 17, 2017  (JP) .............................. JP2017-201422

(51) Int. Cl.
  *H03K 17/082*  (2006.01)
  *H02H 1/00*  (2006.01)
  *H02H 7/12*  (2006.01)

(52) U.S. Cl.
  CPC ....... *H03K 17/0822* (2013.01); *H02H 1/0007* (2013.01); *H02H 7/1203* (2013.01); *H03K 17/0828* (2013.01)

(58) Field of Classification Search
  CPC ........... H03K 17/0822; H03K 17/0828; H03K 17/082–0828; H02H 7/12; H02H 7/1203;
  (Continued)

(56) References Cited

U.S. PATENT DOCUMENTS 5,375,029 A * 12/1994 Fukunaga ............... G05F 1/573
  323/285
6,617,838 B1 * 9/2003 Miranda ............ G01R 19/0092
  324/117 R
(Continued)

FOREIGN PATENT DOCUMENTS

JP  405276761 A  10/1993
JP  406120787 A   4/1994
(Continued)

OTHER PUBLICATIONS

International Search Report and (ISA/237) Written Opinion of the International Search Authority for International Patent Application No. PCT/JP2018/032505, mailed by the Japan Patent Office dated Oct. 2, 2018.

(Continued)

*Primary Examiner* — Jared Fureman
*Assistant Examiner* — Christopher J Clark

(57) ABSTRACT

In recent years, an improvement in detection accuracy of an overcurrent is desired. An overcurrent detection device is provided, which includes a gate current detection unit that detects whether a gate current flowing to a semiconductor element is equal to or above a reference gate current; a sense current detection unit that detects whether a sense current flowing through a sense-emitter terminal of the semiconductor element is equal to or above a reference sense current; and an adjustment unit that decreases a detected value of the sense current relatively to the reference sense current if the gate current is equal to or above the reference gate current.

9 Claims, 7 Drawing Sheets

(58) Field of Classification Search
CPC ....... H02H 7/122–1227; H02H 1/0007; H02H 9/02; H02H 9/025; H02H 3/08–105; G01R 15/04; G01R 17/00; G01R 17/02; G01R 19/0092
See application file for complete search history.

(56) References Cited

U.S. PATENT DOCUMENTS

| | | |
|---|---|---|
| 2007/0139841 A1 | 6/2007 | Ohshima |
| 2013/0083442 A1* | 4/2013 | Hiyama ............. H03K 17/0828 361/93.7 |
| 2014/0375333 A1 | 12/2014 | Minagawa |

FOREIGN PATENT DOCUMENTS

| | | |
|---|---|---|
| JP | 2001345688 A | 12/2001 |
| JP | 2006032393 A | 2/2006 |
| JP | 2007174756 A | 7/2007 |
| JP | 2014117044 A | 6/2014 |
| JP | 2015053749 A | 3/2015 |
| JP | 2015139271 A | 7/2015 |
| WO | 2013190752 A1 | 12/2013 |

OTHER PUBLICATIONS

Office Action issued for counterpart Japanese Application No. 2019-549145, issued by the Japan Patent Office dated Jun. 2, 2020 (drafted on May 27, 2020).

\* cited by examiner

OVERCURRENT DETECTION DEVICE, CONTROL DEVICE, AND OVERCURRENT DETECTION METHOD

The contents of the following Japanese patent application are incorporated herein by reference:
2017-201422 filed in JP on Oct. 17, 2017
PCT/JP2018/032505 filed on Aug. 31, 2018

BACKGROUND

1. Technical Field

The present invention relates to an overcurrent detection device, a control device, and an overcurrent detection method.

2. Related Art

Conventionally, techniques of stopping a control of electrical power when an overcurrent occurs to prevent a destruction of an element is proposed (for example, Patent Documents 1 to 4).
Patent Document 1 Japanese Unexamined Patent Application, Publication No. 2006-32393
Patent Document 2 Japanese Unexamined Patent Application, Publication No. 2015-53749
Patent Document 3 Japanese Unexamined Patent Application, Publication No. 2015-139271
Patent Document 4 Japanese Unexamined Patent Application, Publication No. 6-120787
In recent years, an improvement in detection accuracy of an overcurrent is desired.

SUMMARY

Item 1

In a first aspect of the present invention, an overcurrent detection device is provided. The overcurrent detection device may include a gate current detection unit that detects whether a gate current flowing to a semiconductor element is equal to or above a reference gate current. The overcurrent detection device may include a sense current detection unit that detects whether a sense current flowing through a sense-emitter terminal of the semiconductor element is equal to or above a reference sense current. The overcurrent detection device may include an adjustment unit that decreases a detected value of the sense current relatively to the reference sense current if the gate current is equal to or above the reference gate current.

Item 2

The adjustment unit may decrease the detected value of the sense current if the gate current is equal to or above the reference gate current.

Item 3

The sense current detection unit may include a sense current detection resistor that is electrically connected between a sense-emitter terminal and a reference potential. The sense current detection unit may include a sense current detection comparator that compares a sense detection voltage that is generated by the sense current flowing through a sense current detection resistor with a reference voltage according to the reference sense current. The adjustment unit may decrease the resistance value of the sense current detection resistor if the gate current is equal to or above the reference gate current.

Item 4

The adjustment unit may bypass at least a portion of the sense current detection resistor if the gate current is equal to or above the reference gate current.

Item 5

The gate current detection unit may include a gate current detection resistor that is electrically connected between a gate drive terminal that receives a gate drive signal for driving a gate of the semiconductor element and a gate terminal of the semiconductor element. The gate current detection unit may include a gate current detection comparator that detects whether a gate detection voltage generated by the gate current flowing through the gate current detection resistor is equal to or above a voltage according to the reference gate current.

Item 6

The gate current detection unit may include a first resistance voltage divider that divides a voltage on the gate drive terminal side of the gate current detection resistor. The gate current detection unit may include a second resistance voltage divider that divides a voltage on a side of the gate terminal of the gate current detection resistor. The gate current detection comparator may input the voltage divided by the first resistance voltage divider and the voltage divided by the second resistance voltage divider.

Item 7

The first resistance voltage divider and the second resistance voltage divider may differ in a voltage-division ratio.

Item 8

In a second aspect of the present invention, a control device is provided. The control device may include a gate driving unit that outputs the gate drive signal for driving the gate of the semiconductor element in response to an input signal. The control device may include the overcurrent detection device of the first aspect.

Item 9

The gate driving unit may turn off the semiconductor element in response to that the overcurrent detection device detects that the sense current is equal to or above the reference sense current.

Item 10

In a third aspect of the present invention, an overcurrent detection method is provided. The overcurrent detection method may include detecting whether a gate current flowing to the semiconductor element is equal to or above the reference gate current. The overcurrent detection method may include detecting whether a sense current flowing through the sense-emitter terminal of the semiconductor element is equal to or above the reference sense current. The overcurrent detection method may include adjusting to decrease the detected value of the sense current relatively to the reference sense current if the gate current is equal to or above the reference gate current.

The summary clause does not necessarily describe all necessary features of the embodiments of the present invention. The present invention may also be a sub-combination of the features described above.

BRIEF DESCRIPTION OF THE DRAWINGS

FIG. 5 illustrates an operation waveform when a semiconductor element is turned on.

DESCRIPTION OF EXEMPLARY EMBODIMENTS

Hereinafter, although the present invention will be described through the embodiments of the invention, the following embodiments do not limit the invention according to the scope of the claims. Moreover, not all combinations of features described in the embodiments are essential to the solution of the invention.

Figure 1:
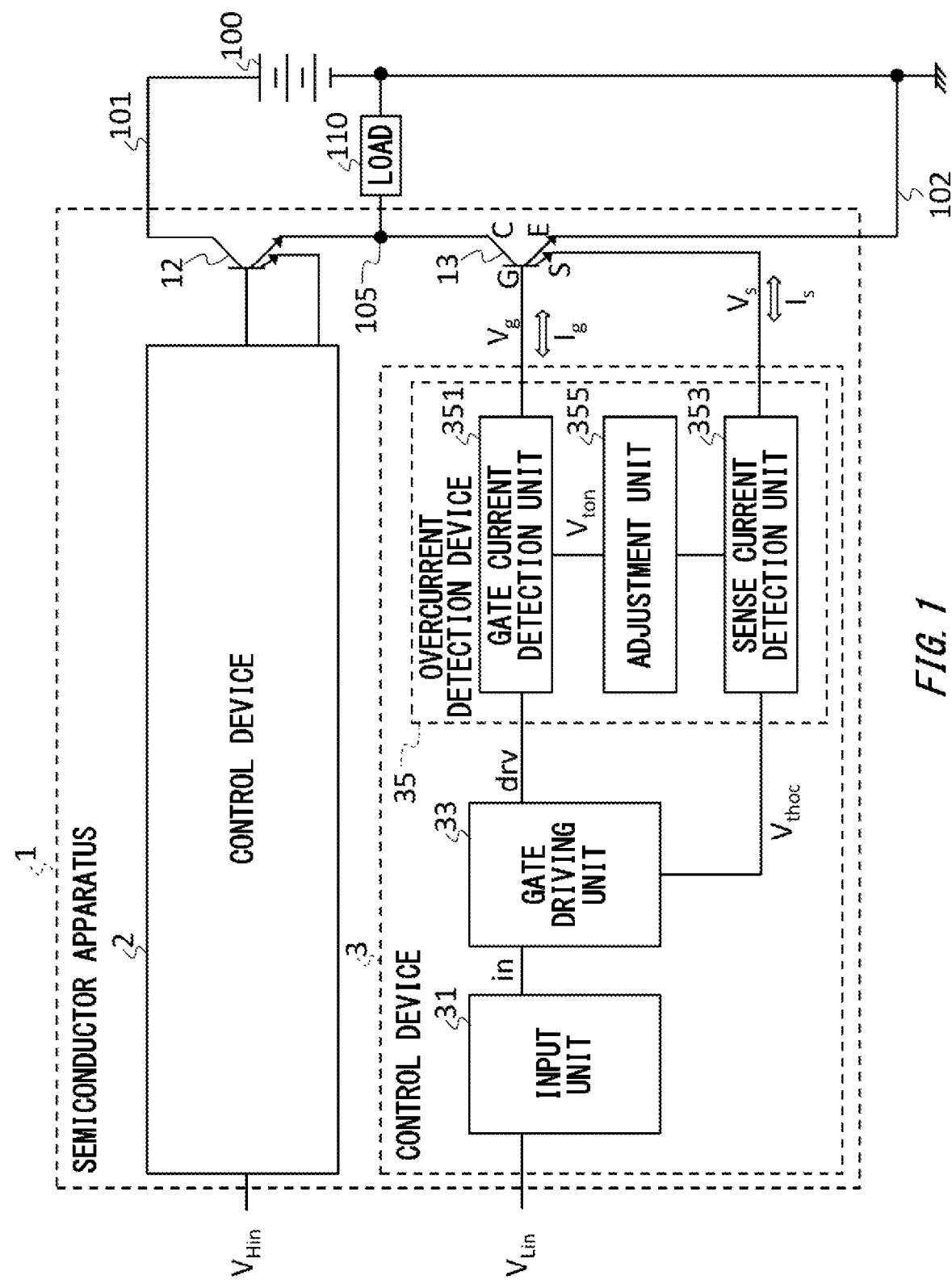
FIG. 1 illustrates a semiconductor apparatus according to the present embodiment.

FIG. 1 illustrates a semiconductor apparatus 1 according to the present embodiment. Note that, white arrows in the drawing indicate currents.

As one example, the semiconductor apparatus 1 may be an intelligent power module used for a motor drive and a power supply, and an AC voltage may be output from a power supply output terminal 105 by switching the connection between a positive side power supply line 101 and the power supply output terminal 105, and the connection between a negative side power supply line 102 and the power supply output terminal 105. The positive side power supply line 101 may be connected to a positive electrode of a DC power source 100 and the negative side power supply line 102 may be connected to a ground. Thereby, a DC voltage of, for example, 600 to 800V may be applied between the positive side power supply line 101 and the negative side power supply line 102. One or more loads 110 may be connected between the power supply output terminal 105 and the ground.

The semiconductor apparatus 1 includes a high-side semiconductor element 12 and a low-side semiconductor element 13 connected in series, a control device 2 associated with a semiconductor element 12, and a control device 3 associated with a semiconductor element 13.

The semiconductor elements 12 and 13 are sequentially connected in series between the positive side power supply line 101 and the negative side power supply line 102. The power supply output terminal 105 may be connected to a middle point between the semiconductor elements 12 and 13.

The semiconductor elements 12 and 13 may be switch elements that are switched on/off by the control devices 2 and 3 described later. As one example, the semiconductor elements 12 and 13 may be respectively a lower arm and an upper arm of a power converter.

At least one of the semiconductor elements 12 and 13 may include a wide bandgap semiconductor. The wide band gap semiconductor is a semiconductor having a larger band gap than a silicon semiconductor and is, for example, a semiconductor such as SiC, GaN, diamond, a gallium nitride based material, a gallium oxide based material, AlN, AlGaN, ZnO or the like. The switch element having the wide-gap semiconductor can improve a switching speed more than an element only having the silicon semiconductor.

Further, as one example, the semiconductor elements 12 and 13 may be voltage-driven transistors and in the present embodiment, as one example, are IGBTs. The semiconductor elements 12 and 13 may be field-effect transistors such as an MOSFET.

The control devices 2 and 3 control the semiconductor elements 12 and 13 in response to input signals $V_{Hin}$ and $V_{Lin}$. A configuration of the control device 2 is the same as that of the control device 3, and thus the description thereof is omitted.

The control device 3 includes an input unit 31, a gate driving unit 33, and an overcurrent detection device 35. Each of the input unit 31 and the gate driving unit 33 may be formed as an electric circuit.

The input unit 31 generates a rectangular signal in from the input signal $V_{Lin}$. For example, when the input signal $V_{Lin}$ is larger than a threshold voltage, the input unit 31 may generate a rectangular signal in that becomes high. The input unit 31 may supply the rectangular signal in to the gate driving unit 33.

In response to the input signal, the gate driving unit 33 outputs a gate drive signal dry for driving the gate terminal (G) of the semiconductor element 13. For example, in response to that the input rectangular signal in becomes high, the gate driving unit 33 may generate the gate drive signal dry and supply the gate drive signal dry to the gate terminal (G) of the semiconductor element 13 via the overcurrent detection device 35.

In response to that the overcurrent detection device 35 detects the overcurrent, the gate driving unit 33 may output the gate drive signal to turn off the semiconductor element 13. For example, in response to that the overcurrent detection device 35 detects the overcurrent of the low-side semiconductor element 13, the gate driving unit 33 may turn off the low-side semiconductor element 13.

The overcurrent detection device 35 detects the overcurrent of the semiconductor element 13. The overcurrent detection device 35 includes a gate current detection unit 351, a sense current detection unit 353, and an adjustment unit 355. Each of the gate current detection unit 351, the sense current detection unit 353, and the adjustment unit 355 may be formed as an electric circuit.

The gate current detection unit 351 detects whether the gate current $I_g$ flowing to the semiconductor element 13 is equal to or above the reference gate current $I_{gth}$. In the present embodiment, since the semiconductor element 13 is an IGBT as one example, depending on the detection by the gate current detection unit 351 as to whether the gate current $I_g$ is equal to or above the reference gate current $I_{gth}$, a the transition period until the semiconductor element 13 becomes the steady ON state is detected. During the transition period, the sense current $I_s$ flowing through a sense-emitter terminal (S) of the semiconductor element 13 also exhibits a transient waveform.

The reference gate current $I_{gth}$ may be any current value set by trial and error and, as one example, may be 0 A. The gate current detection unit 351 may supply the detection signal $V_{ton}$ indicating the detection result to the sense current detection unit 353. In the present embodiment, as one example, the gate current detection unit 351 supplies the detection signal $V_{ton}$ to the sense current detection unit 353 via the adjustment unit 355.

The sense current detection unit 353 detects whether the sense current $I_s$ is equal to or above the reference sense current. The reference sense current may be a current lower limit value of the semiconductor element 13 in the overcurrent condition. Thereby, the overcurrent condition of the semiconductor element 13 is detected. The sense current detection unit 353 may supply, to the gate driving unit 33, the detection signal $V_{thoc}$ indicating the detection result. When the detection signal $V_{thoc}$ indicating the overcurrent condition is supplied to the gate driving unit 33, the gate driving unit 33 may output the gate drive signal dry for turning off the semiconductor element 13.

If the gate current $I_g$ is equal to or above the reference gate current $I_{gth}$, the adjustment unit 355 decreases the detected value of the sense current $I_s$ relative to the reference sense current. For example, the adjustment unit 355 may reduce the detected value of the sense current $I_s$. Thereby, when the semiconductor element 13 is in the transition period, the detected value of the sense current $I_s$ becomes small.

According to the above semiconductor apparatus 1, if the gate current $I_g$ is equal to or above the reference gate current $I_{gth}$, the adjustment unit 355 decreases the detected value of the sense current $I_s$ relatively to the reference sense current, and thus, it is possible to prevent the false detection of the overcurrent during the transition period. Therefore, it is possible to improve the detection accuracy of the overcurrent. Further, since the $I_s$ detection value of the sense current is reduced, a constant reference sense current can be used as compared to a case where the reference sense current increases.

Figure 2:
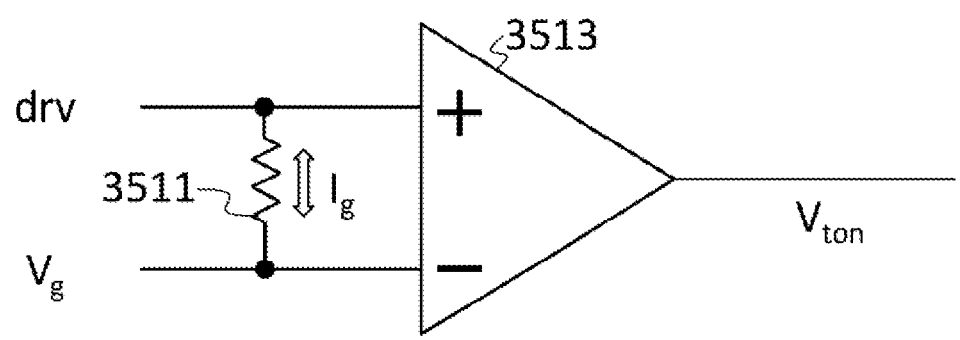
FIG. 2 illustrates a gate current detection unit.

FIG. 2 illustrates the gate current detection unit 351. In the present embodiment, as one example, the gate current detection unit 351 includes a gate current detection resistor 3511 and a gate current detection comparator 3513.

The gate current detection resistor 3511 is electrically connected between the gate drive terminal (not illustrated) of the overcurrent detection device 35 that receives the gate drive signal dry supplied from the gate driving unit 33 and the gate terminal (G) of the semiconductor element 13. Thereby, the gate current detection resistor 3511 converts the gate current $I_g$ flowing between the gate drive terminal and the gate terminal (G) into the voltage.

The gate current detection comparator 3513 detects whether the gate detection voltage caused by the flow of the gate current $I_g$ through the gate current detection resistor 3511 is equal to or above the voltage according to the reference gate current $I_{gth}$. Thereby, the gate current detection comparator 3513 detects whether the gate current $I_g$ of the semiconductor element 13 is equal to or above the reference gate current $I_{gth}$. For example, the gate current detection comparator 3513 may be connected to both ends of the gate current detection resistor 3511 and detect whether the potential difference between the both ends is equal to or above the voltage according to the reference gate current $I_{gth}$. The gate current detection comparator 3513 may supply the detection signal $V_{ton}$ indicating the detection result to the adjustment unit 355.

The gate current detection comparator 3513 may have hysteresis characteristics. For example, when detecting whether the gate detection voltage exceeds the voltage according to the reference gate current, the reference voltage may be set higher than when detecting whether the gate detection voltage falls below the voltage according to the reference gate current. Thereby, even if the gate detection voltage slightly fluctuates in the vicinity of the reference voltage, it is possible to stabilize the detection result.

Figure 3:
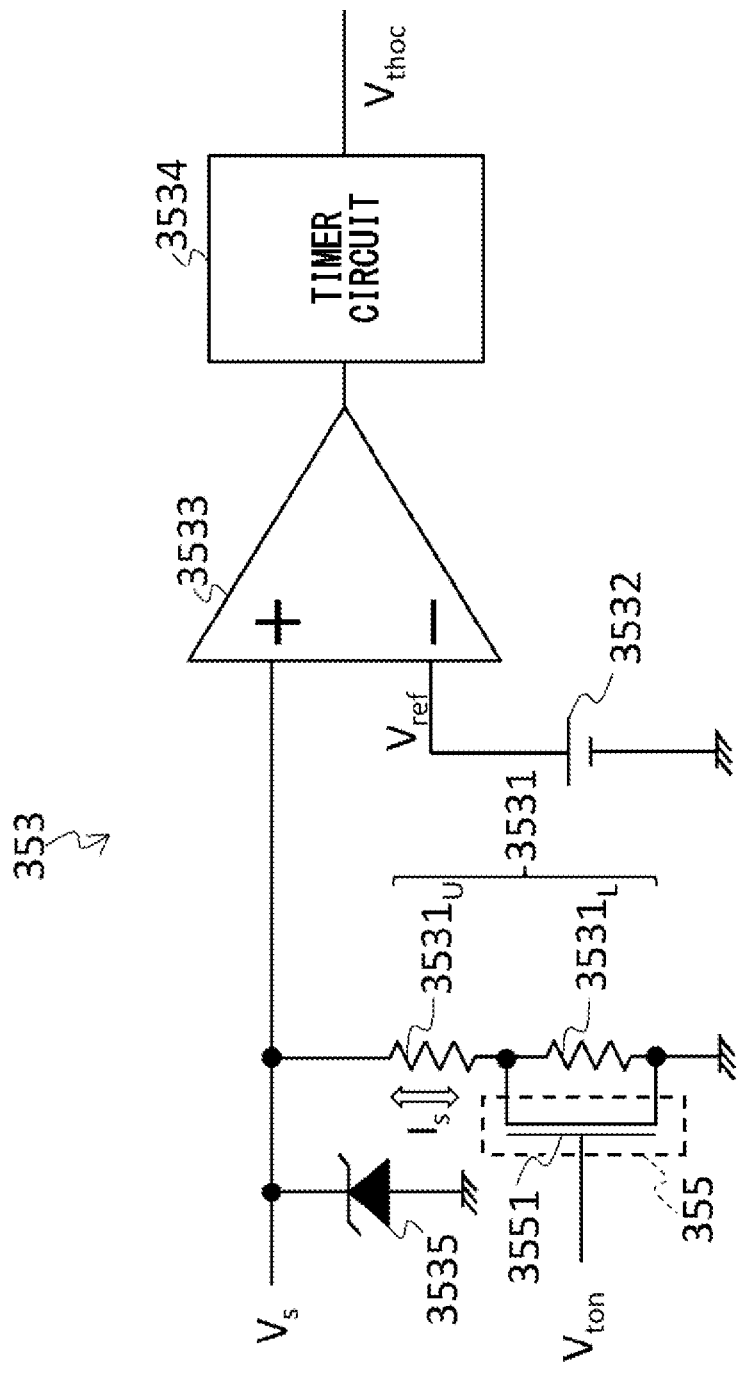
FIG. 3 illustrates a sense current detection unit and an adjustment unit.

FIG. 3 illustrates the sense current detection unit 353 and the adjustment unit 355. In the present embodiment, as one example, the sense current detection unit 353 includes a sense current detection resistor 3531, a reference voltage source 3532, a sense current detection comparator 3533, a timer circuit 3534, and a Zener diode 3535.

The sense current detection resistor 3531 is electrically connected between the sense-emitter terminal (S) of the semiconductor element 13 and a reference potential (in the present embodiment, as one example, a ground potential). Thereby, the sense current $I_s$ output from the sense-emitter terminal (S) flows thorough the sense current detection resistor 3531. In the present embodiment, as one example, the sense current detection resistor 3531 includes two resistors $3531_U$ and $3531_L$ that are connected in series.

The reference voltage source 3532 is connected between the sense current detection comparator 3533 and the ground. The reference voltage source 3532 supplies the reference voltage $V_{ref}$ to the sense current detection comparator 3533.

The sense current detection comparator 3533 compares the sense detection voltage $V_s$ that is caused by the sense current $I_s$ flowing through the sense current detection resistor 3531 with the reference voltage $V_{ref}$ according to the reference sense current. Thereby, the sense current detection comparator 3533 detects whether the sense current $I_s$ flowing through the sense-emitter terminal (S) of the semiconductor element 13 is equal to or above the reference sense current. For example, the sense current detection comparator 3533 may be connected to the sense-emitter terminal (S) of the semiconductor element 13 and the positive electrode of the reference voltage source 3532, and compare the sense detection voltage $V_s$ with the reference voltage $V_{ref}$. The sense current detection comparator 3533 may supply, to the timer circuit 3534, a signal indicating the detection result.

The sense current detection comparator 3533 may have the hysteresis characteristics. For example, when detecting whether the sense detection voltage $V_s$ exceeds the reference voltage $V_{ref}$, the reference voltage $V_{ref}$ may be set higher than when detecting whether the sense detection voltage $V_s$ falls below the reference voltage $V_{ref}$. Thereby, even if the sense detection voltage $V_s$ slightly fluctuates in the vicinity of the reference voltage $V_{ref}$, it is possible to stabilize the comparison result.

The timer circuit 3534 detects whether a state at which the sense current $I_s$ is equal to or above the reference sense current more than a reference time. For example, the timer circuit 3534 may detect whether the duration during which the detection signal supplied from the sense current detection comparator 3533 continues to indicate that the sense detection voltage $V_s$ is equal to or above the reference voltage $V_{ref}$ exceeds the reference time. If the detection signal indicates that the sense detection voltage $V_s$ is less than the reference voltage $V_{ref}$, the timer circuit 3534 may reset the clock time. The timer circuit 3534 may supply, to the gate driving unit 33, the detection signal $V_{thoc}$ indicating the detection result. The timer circuit 3534 may not necessarily be included in the sense current detection unit 353. In this case, the detection signal $V_{thoc}$ indicating the detection result as to whether the sense current $I_s$ is equal to or above the reference sense current may be supplied from the sense current detection comparator 3533 to the gate driving unit 33.

The Zener diode 3535 is electrically connected between the sense-emitter terminal (S) of the semiconductor element 13 and the ground, and protects the sense current detection comparator 3533. The Zener diode 3535 may not necessarily be included in the sense current detection unit 353.

If the gate current $I_g$ is equal to or above the reference gate current $I_{gth}$, the adjustment unit 355 reduces the resistance value of the sense current detection resistor 3531. For example, if the gate current $I_g$ is equal to or above the reference gate current $I_{gth}$, the adjustment unit 355 may bypass at least a portion of the sense current detection resistor 3531. Thereby, the detected value of the sense current $I_s$ decreases.

In the present embodiment, as one example, the adjustment unit 355 includes a semiconductor element 3551. When the detection signal $V_{ton}$ from the gate current detection unit 351 indicates that the gate current $I_g$ of the semiconductor element 13 is equal to or above the reference gate current $I_{gth}$, the semiconductor element 3551 may short-circuit both ends of at least a portion of the sense current detection resistor 3531 (in the present embodiment, as one example, resistor $3531_L$) to reduce the resistance value of the sense current detection resistor 3531. For example, the semiconductor element 3551 may be a transistor whose gate terminal is connected to the gate current detection unit 351 and whose collector terminal and emitter terminal are connected to both ends of the resistor $3531_L$. Although the semiconductor element 3551 is an MOSFET in the present embodiment, as one example, the semiconductor element 3551 may be another type of transistor.

A reduction amount of the resistance value of the sense current detection resistor 3531 may be optionally set by trial and error. For example, the minimum resistance value at which the occurrence of the overcurrent is detected when the semiconductor element 13 is intentionally caused to be in the overcurrent condition by supplying the maximum rated current to the semiconductor element 13 may be set as the resistance value after reduction.

With the above sense current detection unit 353, since the resistance value of the sense current detection resistor 3531 is reduced if the gate current $I_g$ is equal to or above the reference gate current $I_{gth}$, during the transition period of the semiconductor element 13, the sense detection voltage $V_s$ decreases and is compared with the reference voltage $V_{ref}$. Therefore, the false detection of the overcurrent during the transition period of the semiconductor element 13 can be reliably prevented.

Since whether the state where the sense current $I_s$ is equal to or above the reference sense current continues for more than the reference time is detected and thus obtained detection result is supplied to the gate driving unit 33, it is possible to prevent the false detection of the overcurrent, that is caused by the sense current $I_s$ temporarily exceeding the reference sense current.

Figure 4:
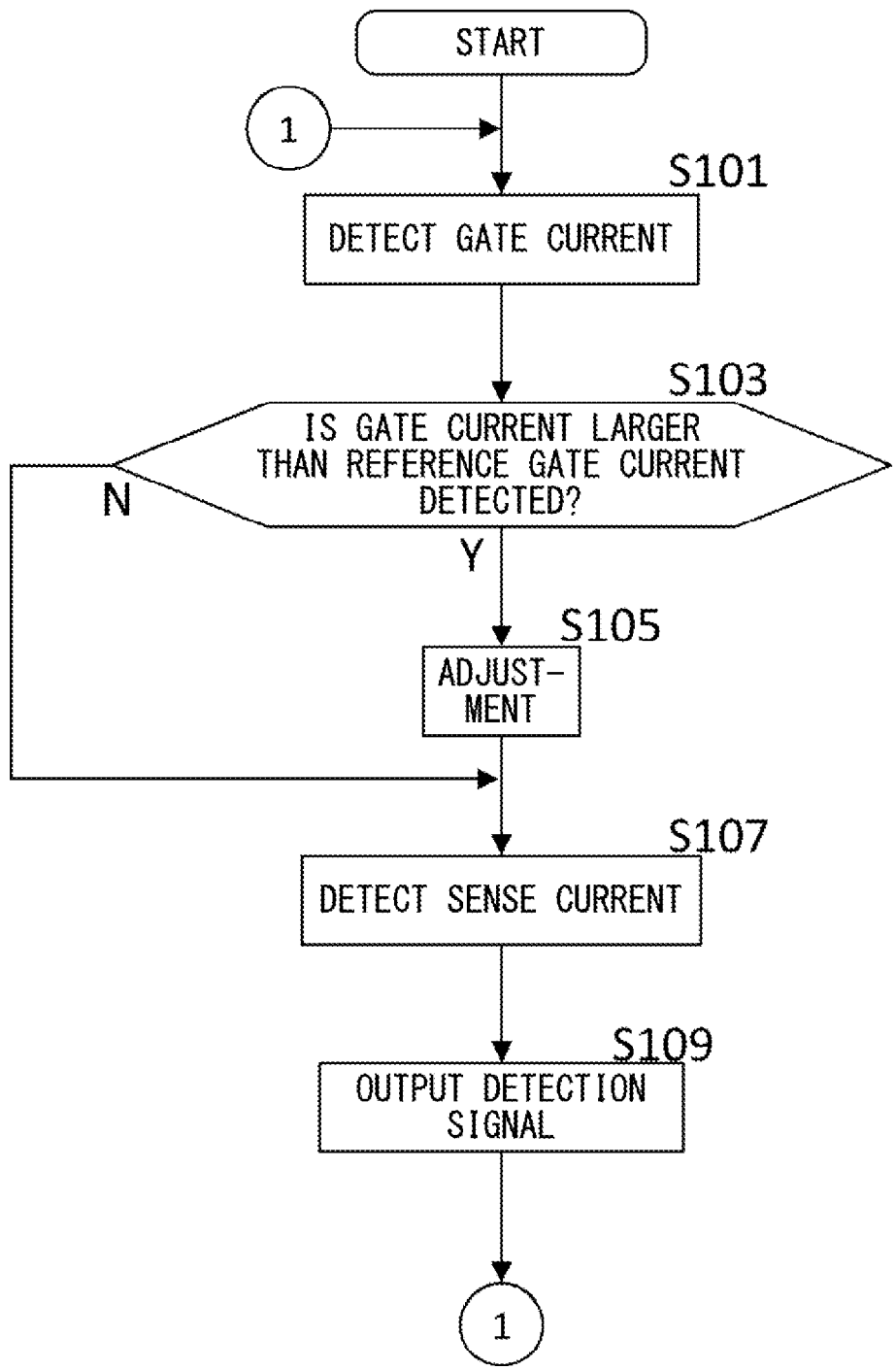
FIG. 4 illustrates an overcurrent detection method according to the present embodiment.

FIG. 4 illustrates an overcurrent detection method according to the present embodiment. The overcurrent detection device 35 detects the overcurrent of the semiconductor element 13 by conducting processes of steps S101 to S109.

First, in step S101, the gate current detection unit 351 detects whether the gate current $I_g$ flowing to the semiconductor element 13 is equal to or above the reference gate current $I_{gth}$. Second, in step S103, the gate current detection unit 351 determines whether the gate current $I_g$ has been detected to be equal to or above the reference gate current $I_{gth}$. When it is determined that the gate current $I_g$ has been detected to be equal to or above the reference gate current $I_{gth}$, the process of overcurrent detection device 35 proceeds to step S105 and when it is determined that the gate current $I_g$ has not been detected to be equal to or above the reference gate current $I_{gth}$, the process of the overcurrent detection device 35 proceeds to step S107.

Third, in step S105, the adjustment unit 355 decreases the detected value of the sense current $I_s$ relatively to the reference sense current. In the present embodiment, as one example, the adjustment unit 355 decreases the sense detection voltage $V_s$ as the detected value of the sense current $I_s$. Fourth, in step S107, the sense current detection unit 353 detects whether the sense current $I_s$ is equal to or above the reference sense current.

Fifth, in step S109, the sense current detection unit 353 supplies, to the gate driving unit 33, the detection signal $V_{thoc}$ indicating the detection result. Thereby, for example, when the detection signal $V_{thoc}$ indicating the overcurrent condition is supplied to the gate driving unit 33, the gate driving unit 33 turns off the semiconductor element 13. Then, the process of the overcurrent detection device 35 proceeds to step S101. The process of step S101 may be conducted each time the gate drive signal dry for instructing the semiconductor element 13 to turn on is input.

Figure 5:
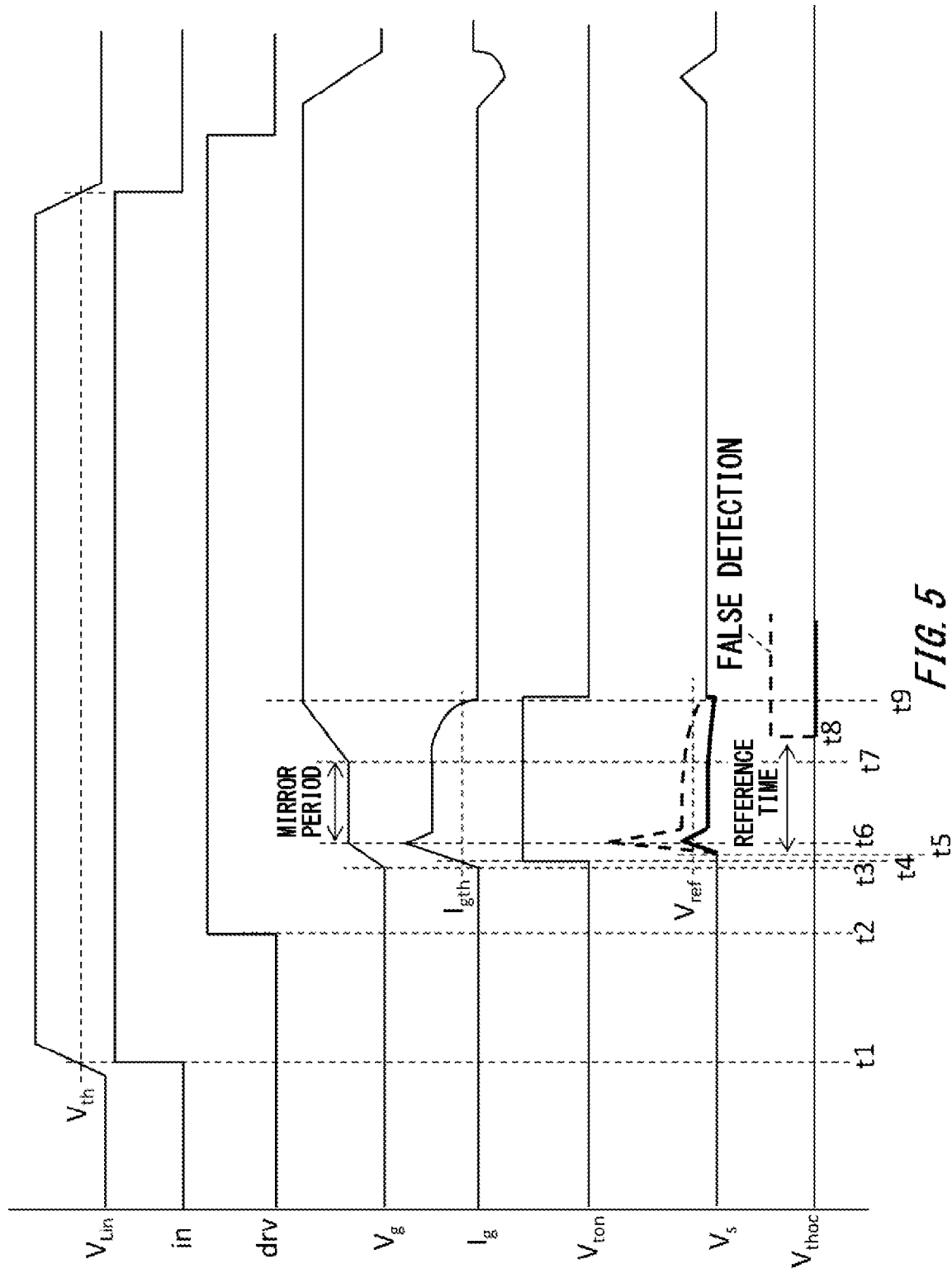

FIG. 5 illustrates an operation waveform when the semiconductor element 13 is turned on. A vertical axis represents a voltage value or a current value, and a horizontal axis represents a time in the drawing. With respect to a portion where both a bold dashed line graph and a bold solid line graph are shown, the bold dashed line graph shows the operation waveform in the overcurrent detection device of the comparative example and the bold solid line graph shows the operation waveform in the overcurrent detection device 35 according to the present embodiment. This operation waveform is one example and may change according to the characteristics of the semiconductor apparatus 1.

First, when the level of the input signal $V_{Lin}$ to be input to an input unit 31 changes from low to high and the input signal $V_{Lin}$ exceeds the threshold voltage $V_{th}$ at time point t1, the level of the rectangular signal in to be input to the gate driving unit 33 becomes high. Accordingly, the level of the gate drive signal dry becomes high at time point t2.

Next, at time point t3, the gate voltage $V_g$ of the semiconductor element 13 starts to rise, and the capacitance between the gate and the collector is charged. Along with this, the gate current $I_g$ rises. Further, the capacitance between the gate and the emitter is charged.

Next, when the gate current $I_g$ exceeds the reference gate current $I_{gth}$ at time point t4, the semiconductor element 13 starts to be turned on and the level of the detection signal $V_{ton}$ supplied from the gate current detection unit 351 becomes high. Next, when the gate voltage $V_g$ reaches a mirror voltage and a mirror period starts at time point t6, the gate current $I_g$ starts to decrease. Then, under the influences of dV/dt of the gate voltage $V_g$ of the semiconductor element 13 and the parasitic capacitance of the semiconductor element 13, the sense current $I_s$ and hence the sense detection voltage $V_s$ increase during a period from time point t5 to time point t6 and start to decrease form time point t6.

Next, at time point t7, the mirror period ends. Along with this, the capacitance between the gate and the collector is charged until the gate voltage $V_g$ reaches the forward bias voltage during the period from time point t7 to time point t9. Then, at time point t9 and thereafter, the gate voltage $V_g$ is maintained at the forward bias voltage and an ON-state of the semiconductor element continues. Further, the sense current $I_s$ and the sense detection voltage $V_s$ have values that become constant.

In the above operation waveform, when a state where the sense detection voltage $V_s$ exceeds the reference voltage $V_{ref}$ continues for more than the reference time, the overcurrent detection device of the comparative example and the overcurrent detection device 35 according to the present embodiment detect that the overcurrent has occurred. During the transition period until the semiconductor element 13 enters the steady ON state, the sense detection voltage $V_s$ may increase rapidly. Therefore, the overcurrent detection device of the comparative example detects that the sense detection voltage $V_s$ has exceeded the reference voltage $V_{ref}$ for a time longer than the reference time in the drawing and erroneously detects that the overcurrent has occurred at time point t8. On the other hand, since the sense detection voltage $V_s$ decreases during the transition period, it is possible to prevent the false detection of the overcurrent by the overcurrent detection device 35 according to the present embodiment.

Although in the above-mentioned embodiment, the adjustment unit 355 decreases the detected value of the sense current $I_s$ if the gate current $I_g$ is equal to or above the reference gate current $I_{gth}$, in addition to/in place of this, the adjustment unit 355 may increase the reference sense current (and hence the reference voltage $V_{ref}$) or may increase the reference time for the duration during which the sense current $I_s$ exceeds the reference sense current. In this case also, it is possible to prevent the false detection of the overcurrent during the transition period. As one example, when the reference voltage $V_{ref}$ is increased, a maximum reference voltage at which the occurrence of the overcurrent is detected when the maximum rated current is supplied to the semiconductor element 13 to intentionally cause the semiconductor element 13 to be in the overcurrent condition may be the increased reference voltage $V_{ref}$.

Figure 6:
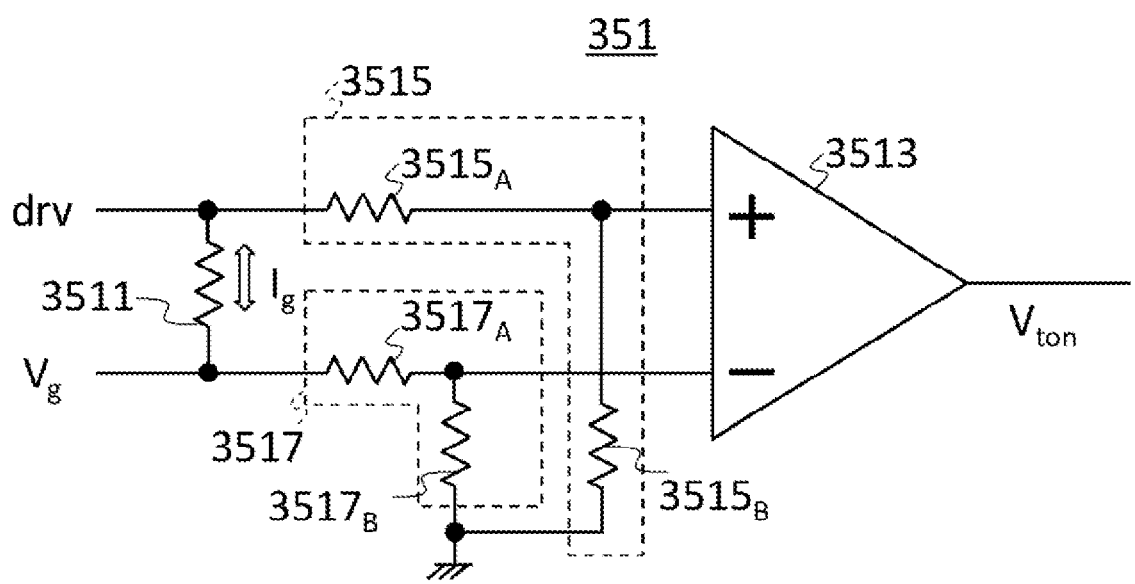
FIG. 6 illustrates a modified example of a gate current detection unit.

Further, the gate current detection unit 351 may have another configuration instead of having the configuration of FIG. 2. FIG. 6 illustrates a modified example of the gate current detection unit 351. The gate current detection unit 351 further includes a first resistance voltage divider 3515 that divides a voltage on a gate drive terminal side (upper side in the drawing) applied of a gate current detection resistor 3511 and a second resistance voltage divider 3517 that divides the voltage on the gate terminal (G) side (lower side in the drawing) applied of the gate current detection resistor 3511. For example, the first resistance voltage divider 3515 may include a resistor $3515_A$ provided between a gate drive terminal and a gate current detection comparator 3513 and a resistor $3515_B$ provided between the gate drive terminal and the ground. The second resistance voltage divider 3517 may include a resistor $3517_A$ provided between the gate terminal (G) and the gate current detection comparator 3513 and a resistor $3517_B$ provided between the gate terminal (G) and the ground. The gate current detection comparator 3513 may receive the voltage divided by the first resistance voltage divider 3515 and the voltage divided by the second resistance voltage divider 3517. Thereby, even when a power-supply voltage of the gate current detection comparator 3513 is smaller than an output voltage of the gate drive unit 33, it is possible to reduce electrical power input to the gate current detection comparator 3513 to reliably detect the transition period. Each of resistors $3515_A$, $3515_B$, $3517_A$, and $3517_B$ of the first resistance voltage divider 3515 and the second resistance voltage divider 3517 may have large resistance values around 100 kΩ to 10 MΩ. Thereby, it is possible to reduce an influence on the gate current Ig flowing through the gate current detection resistor 3511. The first resistance voltage divider 3515 and the second resistance voltage divider 3517 may differ in voltage-division ratio. In this case, a potential difference between the voltage of the gate drive terminal side applied to the gate current detection resistor 3511 and the voltage of the gate terminal (G) side applied to the gate current detection resistor 3511 can be increased or decreased.

Figure 7:
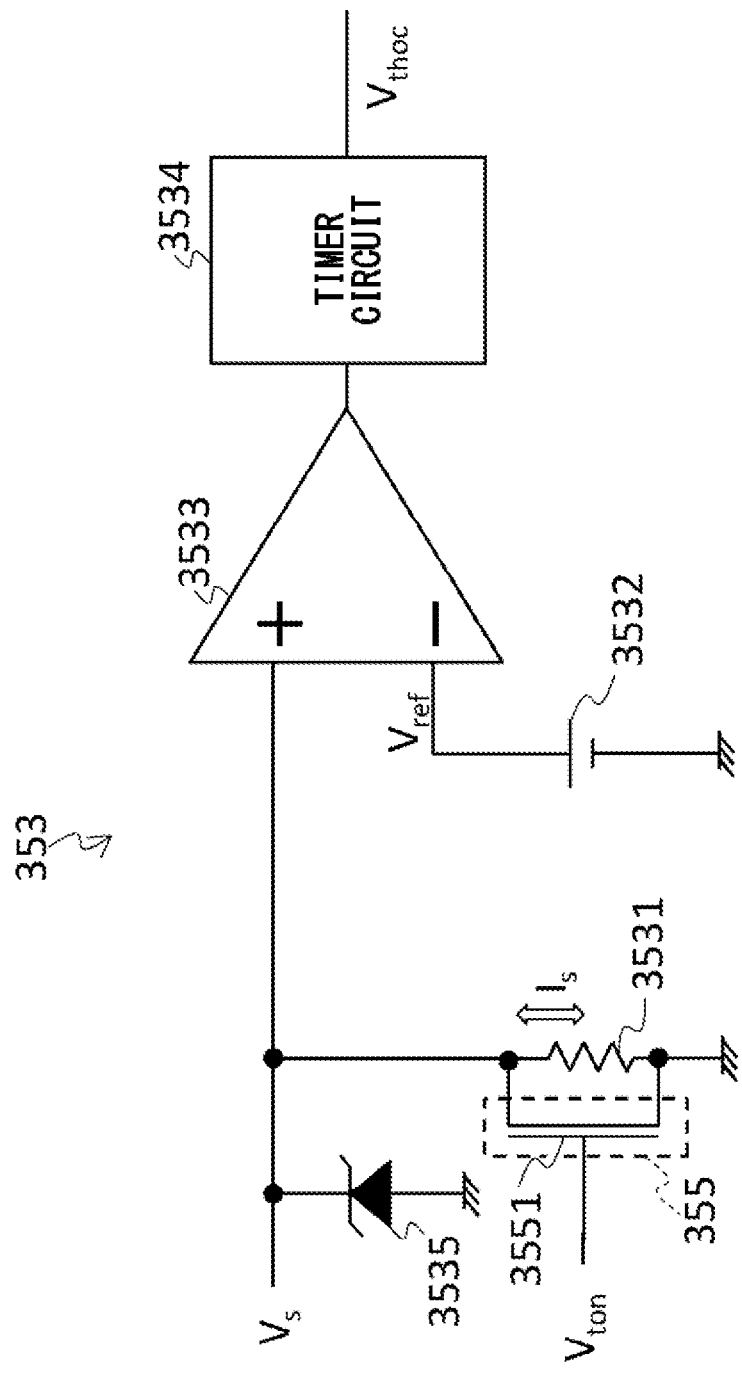
FIG. 7 illustrates a modified example of a sense current detection unit.

Further, the sense current detection unit 353 may have another configuration instead of having the configuration of FIG. 3. FIG. 7 illustrates a modified example of the sense current detection unit 353. This sense current detection unit 353 includes a sense current detection resistor 3531 whose both ends are connected to the collector terminal and the emitter terminal of the semiconductor element 3551 in the adjustment unit 355. In this case, if the gate current $I_g$ is equal to or above the reference gate current $I_{gth}$, the adjustment unit 355 bypasses the entire sense current detection resistor 3531. Thereby, since the sense detection voltage $V_s$ is generated by the sense current $I_s$ flowing through the ON-resistance of the semiconductor element 3551, the sense current detection comparator 3533 compares the sense detection voltage $V_s$ with the reference voltage $V_{ref}$. The ON-resistance of the semiconductor element 3551 may be larger than a break-down resistance of the Zener diode 3535.

Although it has been described that the semiconductor apparatus 1 includes the two semiconductor elements 12 and 13, the semiconductor apparatus 1 may not include one of these, or may include another element instead of one of these. In this case, the semiconductor apparatus 1 may include only one of the two control devices 2 and 3.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: semiconductor apparatus, 2: control device, 3: control device, 12: semiconductor element, 13: semiconductor element, 31: input unit, 33: gate drive unit, 35: overcurrent detection device, 100: DC power source, 101: positive side power supply line, 102: negative side power supply line, 105: power supply output terminal, 110: load, 351: gate current detection unit, 353: sense current detection unit, 355: adjustment unit, 3511: gate current detection resistor, 3513: gate current detection comparator, 3531: sense current detection resistor, 3532: reference voltage source, 3533: sense current detection comparator, 3534: timer circuit, 3535: Zener diode, 3551 semiconductor element, 3515: first resistance voltage divider, 3517: second resistance voltage divider

What is claimed is:

1. An overcurrent detection device comprising:
a gate current detection unit that detects whether a gate current flowing to a semiconductor element is equal to or above a reference gate current;
a sense current detection unit that detects whether a state at which a sense current flowing through a sense-emitter terminal of the semiconductor element is equal to or above a reference sense current exists for more than a reference time; and
an adjustment unit that decreases a detected value of the sense current relative to the reference sense current if the gate current is equal to or above the reference gate current,
wherein the adjustment unit lengthens the reference time if the gate current is equal to or above the reference gate current.

2. The overcurrent detection device according to claim 1, wherein
the sense current detection unit includes:
a sense current detection resistor that is electrically connected between the sense-emitter terminal and a reference potential; and
a sense current detection comparator that compares a sense detection voltage caused by the sense current flowing through the sense current detection resistor with a reference voltage according to the reference sense current, and
the adjustment unit decreases a resistance value of the sense current detection resistor if the gate current is equal to or above the reference gate current.

3. The overcurrent detection device according to claim 2, wherein
the adjustment unit bypasses at least a portion of the sense current detection resistor if the gate current is equal to or above the reference gate current.

4. The overcurrent detection device according to claim 1, wherein
the gate current detection unit includes:
a gate current detection resistor that is electrically connected between a gate drive terminal that receives a gate drive signal for driving a gate of the semiconductor element and a gate terminal of the semiconductor element; and
a gate current detection comparator that detects whether a gate detection voltage that is generated by the gate current flowing through the gate current detection resistor is equal to or above a voltage according to the reference gate current.

5. The overcurrent detection device according to claim 4, wherein
the gate current detection unit further includes:
a first resistance voltage divider that divides a voltage of a gate drive terminal side of the gate current detection resistor; and
a second resistance voltage divider that divides a voltage of a side of the gate terminal of the gate current detection resistor; and
the gate current detection comparator receives a voltage divided by the first resistance voltage divider and a voltage divided by the second resistance voltage divider.

6. The overcurrent detection device according to claim 5, wherein
the first resistance voltage divider and the second resistance voltage divider differ in a voltage-division ratio.

7. A control device comprising:
a gate drive unit that outputs the gate drive signal for driving a gate of the semiconductor element in response to an input signal; and
the overcurrent detection device according to claim 4.

8. The control device according to claim 7, wherein
the gate drive unit outputs the gate drive signal for turning off the semiconductor element in response to the overcurrent detection device detecting that the sense current is equal to or above the reference sense current.

9. An overcurrent detection method comprising:
detecting whether a gate current flowing to a semiconductor element is equal to or above a reference gate current;
detecting whether a state at which a sense current flowing through a sense-emitter terminal of the semiconductor element is equal to or above a reference sense current exists more than a reference time;
lengthening the reference time if the gate current is equal to or above the reference gate current; and
adjusting to reduce a detected value of the sense current relative to the reference sense current if the gate current is equal to or above the reference gate current.

* * * * *